US00RE48528E

(19) United States
(12) Reissued Patent
White et al.

(10) Patent Number: US RE48,528 E
(45) Date of Reissued Patent: Apr. 20, 2021

(54) ANTENNA ARRAY WITH WIDE-BAND REACTANCE CANCELLATION

(71) Applicant: HRL LABORATORIES, LLC, Malibu, CA (US)

(72) Inventors: Carson R. White, Augora Hills, CA (US); Jonathan J. Lynch, Oxnard, CA (US)

(73) Assignee: HRL Laboratories, LLC, Malibu, CA (US)

(21) Appl. No.: 15/842,793

(22) Filed: Dec. 14, 2017

Related U.S. Patent Documents

Reissue of:
(64) Patent No.: 9,214,724
Issued: Dec. 15, 2015
Appl. No.: 13/856,375
Filed: Apr. 3, 2013

U.S. Applications:
(60) Provisional application No. 61/620,384, filed on Apr. 4, 2012.

(51) Int. Cl.

| | |
|---|---|
| ***H01Q 21/00*** | (2006.01) |
| ***H03H 7/48*** | (2006.01) |
| ***H01Q 1/52*** | (2006.01) |
| ***H01Q 3/26*** | (2006.01) |
| ***H01Q 21/14*** | (2006.01) |
| ***H01Q 21/20*** | (2006.01) |
| ***H03H 7/52*** | (2006.01) |
| *H01Q 21/28* | (2006.01) |

(52) U.S. Cl.
CPC ..... *H03H 7/485* (2013.01); *H01Q 1/523* (2013.01); *H01Q 3/26* (2013.01); *H01Q 21/0006* (2013.01); *H01Q 21/14* (2013.01); *H01Q 21/20* (2013.01); *H03H 7/48* (2013.01); *H03H 7/52* (2013.01); *H01Q 21/28* (2013.01)

(58) Field of Classification Search
CPC ..... H03H 7/485; H03H 7/52; H03H 7/48; H01Q 3/26; H01Q 21/14; H01Q 21/0006; H01Q 21/20; H01Q 1/523; H01Q 21/28
USPC ..... 343/810, 816, 850, 852, 853, 893
See application file for complete search history.

(56) References Cited

U.S. PATENT DOCUMENTS 3,939,477 A * 2/1976 Green ..... G01S 3/22 342/445
5,237,336 A * 8/1993 Jelloul ..... H01Q 21/14 343/799

(Continued)

FOREIGN PATENT DOCUMENTS

JP 2011-205316 10/2011

OTHER PUBLICATIONS

Non-Foster Networks for Improvement of Radiation Efficiency and Effective Diversity Gain of a Multi-port Antenna, Karlsson et al., Antenna and Propagation (EuCAP) 2010 Proceedings of the Fourth European Conference, 2010, pp. 1-4. (Year: 2010).*

(Continued)

*Primary Examiner* — Kenneth Whittington
(74) *Attorney, Agent, or Firm* — Ladas & Parry

(57) ABSTRACT

An antenna array containing two or more radiating elements, with nearest neighbor radiating elements connected together with a non-Foster circuit at terminals of the radiating elements such that mutual reactance of the elements is reduced over a wider bandwidth than which would be obtained if the non-Foster circuits were omitted.

22 Claims, 11 Drawing Sheets

(56) References Cited

U.S. PATENT DOCUMENTS

| | | | | |
|---|---|---|---|---|
| 6,121,940 | A | 9/2000 | Skahill et al. | 343/850 |
| 6,249,261 | B1 * | 6/2001 | Solberg et al. | G01S 3/04 343/801 |
| 7,307,494 | B2 | 12/2007 | Erb | |
| 7,688,273 | B2 | 3/2010 | Montgomery et al. | 343/893 |
| 7,898,493 | B1 | 3/2011 | Rojas et al. | H01Q 5/00 343/850 |
| 9,031,519 | B2 * | 5/2015 | Nilsson | H01Q 3/24 455/101 |
| 2003/0201843 | A1 | 10/2003 | Luen et al. | |
| 2008/0258991 | A1 * | 10/2008 | Montgomery | H01Q 1/243 343/844 |
| 2009/0184879 | A1 * | 7/2009 | Derneryd et al. | H01Q 1/52 343/853 |
| 2010/0188300 | A1 | 7/2010 | Anguera et al. | |
| 2010/0248651 | A1 | 9/2010 | Dent | |
| 2011/0165853 | A1 * | 7/2011 | Robert et al. | 455/269 |
| 2011/0188552 | A1 | 8/2011 | Yoon et al. | |
| 2014/0300431 | A1 | 10/2014 | Lynch | |

OTHER PUBLICATIONS

Hansen, Radio Science, vol. 39, RS4004, doi:10.1029/2004RS003043, 2004, pp. 1-14.*

R.C. Hansen, "Fundamental Limitations in Antennas", *Proceedings of the IEEE,* 69(2), 1981, pp. 170-182.

K. Buell, et al. "Metamaterial Insulator Enabled Superdirective Array", *IEEE Transactions on Antennas and Propogation,* 55(4), 2007, pp. 1074-1085.

M.M. Dawould, et al., "Superdirectivity with Appreciable Bandwith in Arrays of Radiating Elements Fed by Microwave Transistors", *Proceedings of the 4th European Microwave Conference,* Montreux, Switzerland, 1974, pp. 278-282.

C.K. Edwin Lau, et al., "Minimum Norm Mutual Coupling Compensation with Applications in Direction of Arrival Estimation", *IEEE Transactions on Antennas and Propagation,* 52(8), 2004, pp. 2034-2041.

C. Volmer, et al. "Broadband Decopuling and Matching of a Superdirective Two-Port Antenna Array", *IEEE Antennas and Wireless Propagation Letters,* vol. 7, 2008, pp. 613-616.

S.E. Sussman-Fort, et al.., "Non-Foster Impedance Matching of Electrically-Small Antennas", *IEEE Transactions on Antennas and Propagation,* 57(8), 2009, pp. 2230-2241.

J.G. Linvill, "Transistor Negative-Impedance Converters", *Proceedings of the Institute of Radio Engineers,* 41(6), 1953, pp. 725-729.

S.E. Sussman-Fort, et al., "Progress in Use of Non-Foster Impedances to Match Electrically-Small Antennas and Arrays", *Proceedings of the Antenna Applications Symposium,* 2005, pp. 89-108.

R.C. Hansen, "Wideband Dipole Arrays Using Non-Foster Coupling", *Microwave and Optical Technology Letters*38(6), 2003, pp. 453-455.

A. Platzker et al., "Rigorous Determination of the Stability of Linear N-Node Circuits from Network Determinants and the Appropriate Role of the Stability Factor K of their Reduced Two-Ports,", *Third International Workshop on Integrated Nonlinear Microwave and Millimiterwave Circuits,* 1994, pp. 93-107.

J.C. Coetzee, et al., "Port Decoupling for Small Arrays by Means of an Eigenmode Feed Network", *IEEE Transactions on Antennas and Propagation,* 56(6), 2008, pp. 1587-1593.

J. J. Lynch, "A Modal Description of Multiport Antennas", *International Journal of Antennas and Propagation,* vol. 2011, 2011, Article ID 438437, 12 pages.

N. Marcuvitz (ed.), *Waveguide Handbook,* McGraw-Hill, NY, 1951, p. 117.

From U.S. Appl. No. 13/856,403, filed Apr. 3, 2013, now published as US 2014-0300431 A1), Application and Office Actions.

PCT International Preliminary Report on Patentability Chapter II from PCT/US2013/035183 dated Sep. 15, 2014.

PCT International Preliminary Report on Patentability Chapter I from PCT/US2013/035183 issued on Oct. 7, 2014.

PCT International Preliminary Report on Patentability Chapter I from PCT/US2013/035185 issued on Oct. 7, 2014.

White, Carson R., "A non-foster monopole array," Antennas and Propagation Society International Symposium (APSURSI), 2012 IEEE, 2 pages.

White, Carson R., et al., "A Non-Foster VHF Monopole Antenna," IEEE Antennas and Wireless Propagation Letters, vol. 11, 2012, pp. 584-587.

ISR and WO for related PCT/US2013/035185 mailed on Jul. 25, 2013.

ISR and WO for related PCT/US2013/035183 mailed on Jul. 25, 2013.

Chua, Ping Tyng, et al. "Microstrip Decoupling Networks for Low-Order Multi-Port Arrays with Reduced Element Spacing", Microwave and Optical Technology Letters, Sep. 20, 2005, vol. 46, Issue 6, pp. 592-597.

Yazdanbakhs, P., et al. "Optimization of Monopole four-Square Array Antenna using a decoupling network and a neural network to model ground plane effects", In: Antennas and Propagation, 2009. EuCAP2009, 3rd European Conference, Mar. 23-27, 2009, pp. 3014-3018.

Zhang, et al. "Design and Investigation of Broadband Monopole Antenna Loaded with Non-Foster Circuit," 2010, Progress in Electromagnetics Research C. vol. 17, pp. 245-255.

From U.S. Appl. No. 13/856,403 (now published as US 2014/0300431 A1), Office Action mailed on May 8, 2015.

Allen, John L., "Gain and impedance variation in scanned dipole arrays," IRE Transactions on Antennas and Propagation, Sep. 1962, pp. 566-572.

Coetzee, Dual-Frequency Decoupling Networks for Compact Antenna Arrrays, Hindawi Publishing Corporation, International Journal of Microwave Science and Technology, vol. 2011, Article ID 249647 (4 pages).

Hirvonen et al., Bandwidth Limitations of Dipoles Matched With Non-Foster Impedances, Proceedings of European Conference on Antennas Propagat. Eucap 2007, Nov. 2007 (5 pages).

Chaloupka, H.j., Wang, X. and Coetzee, J.C., "A superdirective 3-element array for adaptive beamforming," Microwave and Optical Technology Letters, vol. 36, No. 6, pp. 425-430, 2003.

Chen, S.C., Wang, Y.S., and Chung, S.J., "A decoupling technique for increasing the port isolation between two strongly coupled antennas," IEEE Transactions on Antennas and Propagation, vol. 56, No. 12, pp. 3650-3658, 2008.

Chua, P.T. and Coetzee, J.C., "Microstrip decoupling networks for low-order multi-port arrays with reduced element spacing," Microwave and Optical Technology Letters, vol. 46, No. 6, pp. 592-597, 2005. (16 pages).

Coetzee, J.C. and Yu, Y., "Closed-form design equations for decoupling networks of small arrays," Electronics Letters, vol. 44, No. 25, pp. 1441-1442, 2008.

Coetzee, J.C. and Yu, Y., "Design of decoupling networks for circulant symmetric antenna arrays," IEEE Antennas and Wireless Propagation Letters, vol. 8, pp. 291-294, 2009.

Ludwig, A.C., "Mutual coupling, gain and directivity of an array of two identical antennas," IEEE Transactions on Antennas and Propagation, vol. 24, No. 6, pp. 837-841, 1976.

Pozar, D.M. Microwave Engineering, John Wiley & Sons, Hoboken, NJ, USA, 2005.(16 pages, preface and table of contents).

Weber, J., Volmer C., Blau, K., Stephan, R. and Hein, M.A., "Miniaturized antenna arrays using decoupling networks with realistic elements," IEEE Transactions on Microwave Theory and Techniques, vol. 54, No. 6, pp. 2733-2740, 2006.

* cited by examiner (a) Stability vs $C_s$ and $C_p$ when $R_{ps}$=-90 Ohms (b) Even-Mode Transducer Gain at 50 MHz (c) Odd-Mode Transducer Gain at 50 MHz (a) Stability vs $C_s$ and $C_p$ when $R_{ps}$ =-75 Ohms (b) Even-mode Transducer Gain at 50 MHz (c) Odd-mode Transducer Gain at 50 MHz (a) Stability vs $C_s$ and $C_p$ when $R_{ps}$ =-300 Ohms (b) Even-mode Transducer Gain at 50 MHz (c) Odd-mode Transducer Gain at 50 MHz (b) Functional Schematic non-Foster Network. Three NICs convert variable resistors and capacitors to their negative values (a) Abstracted Schematic non-Foster Network

ANTENNA ARRAY WITH WIDE-BAND REACTANCE CANCELLATION

Matter enclosed in heavy brackets [ ] appears in the original patent but forms no part of this reissue specification; matter printed in italics indicates the additions made by reissue; a claim printed with strikethrough indicates that the claim was canceled, disclaimed, or held invalid by a prior post-patent action or proceeding.

CROSS REFERENCE TO RELATED APPLICATIONS

This application claims the benefit of U.S. Provisional Patent Application No. 61/620,384 filed Apr. 4, 2012, the disclosure of which is hereby incorporated herein by this reference. This application is also related to U.S. patent application Ser. No. 13/856,403 filed on Apr. 3, 2013 and entitled "Broadband non-Foster Decoupling Networks for Superdirective Antenna Arrays" the disclosure of which is also hereby incorporated herein by reference.

STATEMENT REGARDING FEDERALLY SPONSORED RESEARCH OR DEVELOPMENT

None.

TECHNICAL FIELD

An antenna array having greater efficiency than prior art. The array (i) is capable of producing superdirective beams; (ii) may be electrically small; and (iii) may be both capable of producing superdirective beams and also be electrically small at the same time.

BACKGROUND

Superdirective antennas typically comprise two or more radiating elements in close proximity (the spacing of the radiating (or receiving) elements is $<\lambda/4$, where $\lambda$ is the wavelength of the signal to be radiated and/or received by the antenna).

Antenna arrays are used in numerous applications: communications, radar, signal intelligence, etc. Perhaps the most attractive features of antenna arrays are beam-synthesis and reconfigurability. For example, phased arrays have one or more beams that may be reconfigured to point in different directions or have different beam characteristics by changing the weight (phase and/or amplitude) applied to the signal at each antenna element. In digital beamforming arrays, the signal may be recorded independently at each element, and beams may be formed in post processing. Multiple-Input and Multiple-Output (MIMO) technology, known in the art, can be important in wireless communications systems since because it offers data throughput improvements without using additional bandwidth or increasing transmit power.

Array synthesis techniques are available in the literature that show how to a) increase the directivity of the array without increasing the physical size and b) generate nulls in the radiation pattern that will provide immunity to interfering or jamming signals. However, these techniques have severe limitations in real arrays due to mutual coupling. Specifically, it is well known that prior art superdirective antenna arrays have a high Q, and therefore suffer from a corresponding efficiency/bandwidth limitation. Due to this limitation, superdirective antenna arrays are widely regarded as problematic and are not widely deployed. This invention reduces the Q of superdirective antennas by more than 10 times, providing greater than a 10 dB improvement in the realized gain (RF efficiency) of superdirective antennas. This reduction in Q is also helpful in generating pattern nulls.

Electrically small antennas are antennas which are rather small (or short) compared to the wavelengths of the radio frequencies they are intended to receive. Conventional full length antennas are typically a'4 or ½ wavelength in size. At the frequencies used for some handheld device applications, antennas which are much smaller are called for. Electrically small antennas can be defined as antennas whose elements are 1/10 (or less) of a wavelength of the radio frequencies they are intended to receive. Electrically small antennas also tend to have high Qs, so they tend to have a small bandwidth compared to conventional antennas.

The prior art may include:

Passive Superdirective Arrays:

There is plentiful academic work (starting with Oseen in 1922) that reveals the difficulty of realizing significant bandwidth and efficiency. Two key conclusions are that optimum directivity leads to extremely high Q and that mutual coupling makes for difficult feed network design. Few arrays have been realized, and these arrays have efficiencies <−20 dB. The practical limitations are:

(1) High Antenna Q small bandwidth;

(2) Low radiation resistance low efficiency; and (3) Tight tolerances difficult to realize feed network.

For a paper on the subject, see R. C. Hansen, "Fundamental Limitations in Antennas," Proceedings of the IEEE, v. 69, no. 2, February 1981.

The Use of Metamaterials Placed Between Radiating Elements to Decouple them:

See, for example, K. Buell, et al. "Metamaterial Insulator Enabled Superdirective Array," IEEE Trans. Antenn. Prop., April, 2007. The disadvantages of this approach are:

(1) Narrow bandwidth;

(2) Only applicable to printed antennas;

(3) Complicated fabrication; and (4) Not easily tuned.

Active Antennas:

Directly feed antennas with transistor active impedance matching networks. This works because transistor active component inputs and outputs are approximated by open circuits and hard sources, respectively. Therefore, mutual coupling has no effect. However, the antennas are not matched, resulting in low receiver sensitivity and low transmit efficiency. For example, see M. M. Dawoud and A. P. Anderson, "Superdirectivity with appreciable Bandwidth in Arrays of Radiating Elements Fed by Microwave Transistors," European Microwave Conference, 1974.

Digital Beamforming:

An analog-to-digital converter at each antenna element digitizes the signal so that arbitrary beams may be formed in the digital domain. In addition, mutual coupling can be accounted for in the beamforming (see C. K. Edwin Lau, Raviraj S. Adve, and Tapan K. Sarkar, "Minimum Norm Mutual Coupling Compensation With Applications in Direction of Arrival Estimation," IEEE Transactions on Antennas and Propagation, Vol. 52, No. 8, August 2004, pp. 2034-2041). However, the physical impedance match is only valid for a single radiation pattern, which results in limited receive sensitivity for other patterns. Furthermore, high resolution and high dynamic range analog-to-digital converters are needed to realize superdirective patterns.

Decoupling Networks:
Decoupling Networks result in independent modes with orthogonal patterns from the antenna array. These modes can be matched independently and used to synthesize arbitrary radiation patterns. However, this approach does not reduce antenna Q. For reference, see Christian Volmer, Metin Sengül, Jörn Weber, Ralf Stephan, and Matthias A. Hein, "Broadband Decoupling and Matching of a Superdirective Two-Port Antenna Array, IEEE AWPL, vol. 7, 2008.

Multimode Antenna Structure:
This technology connects nearby antennas with conductors to decouple them. The approach is narrowband and alters the radiation modes of the structure. Furthermore, seems to only be applicable to small numbers of elements. See U.S. Pat. No. 7,688,273.

Non-Foster Matching Circuits for Single Antennas:
See the following documents and the comment below:

S. E. Sussman-Fort and R. M. Rudish, "Non-Foster impedance matching of electrically-small antennas," IEEE Trans. Antennas Propagat., vol. 57, no. 8, August 2009.

J. G. Linvill, "Transistor Negative Impedance Converters," Proc. IRE, vol. 41, no. 6, pp. 725-729, June 1953.

This prior art technology pertains to single antennas rather than to antenna arrays.

Non-Foster Matching Circuits Connected in Series with Array Elements or Between Dipole Ends in Large Arrays:
See the following documents and the comments below:

(1) S. E. Sussman-Fort and R. M. Rudish "Progress in use of non-Foster impedances to match electrically-small antennas and arrays," Antenna Applications Symposium Digest, 2005.

(2) R. C. Hansen, "Wideband Dipole Arrays Using Non-Foster Coupling," Microwave and Optical Technology Letters, 38(6), Sep. 20, 2003, pp. 453-455.

(3) Applicable to large arrays, not to superdirectivity. Calculations are valid for conventional phased array scanning.

(4) Does not match all modes simultaneously.

Superdirectivity has been sought after for 90 years, and is still regarded as impractical due to the resulting high antenna Q. The prior art in superdirectivity is not capable of reducing the antenna Q. Previous approaches produce either narrowband results or low efficiency.

BRIEF DESCRIPTION OF THE INVENTION

This invention relates to an antenna array capable of producing superdirective beams with higher RF efficiency than available in the prior art. This is achieved by canceling the array self and mutual reactance using non-Foster circuits (NFCs), thereby significantly reducing the antenna quality factor, Q (where Q is used here as the ratio of reactance to radiation resistance). Non-Foster circuits employ active devices and therefore are not bound by Foster's reactance theorem (which states that the reactance or susceptance of any passive lossless one-port network must increase with increasing frequency). Typical NFCs are negative capacitors (which have reactance given by $$X = +\frac{1}{\omega|C|},$$

where C is the capacitance and ω is the radian frequency) and negative inductors (which have reactance given by $X=-\omega|L|$, where L is the inductance and w is the radian frequency).

This invention can be used in many antenna applications—it is not limited to use with superdirective arrays. Superdirective arrays are just one example of antenna systems with high Qs and hence small bandwidth. Electrically small antennas are another example of antenna systems with high Qs and hence small bandwidth. This invention can improve the bandwidth of any antenna or antenna system and therefore it is not limited to either superdirective arrays or electrically small antennas. This invention may be used in MIMO applications.

BRIEF DESCRIPTION OF THE DRAWINGS

FIGS. 1c and 1d depict beamforming networks that may produce single (FIG. 1c) and multiple simultaneous (FIG. 1d) beams, respectively.

FIG. 2a depicts the antenna geometry of a 4-element Adcock array made from four monopole antennas 10, while

FIG. 6a depicts the geometry of a 2-element antenna array where radiating elements are monopoles and capacitors $C_S$ and $C_P$ are negative and cancel the self and mutual reactance, respectively, while

FIG. 8 depicts simulated transducer gain (ratio of power accepted by the antenna array to the available power) of the even and odd modes of the passive (in black) and non-Foster enhanced (in grey) arrays with ideal negative capacitors assuming $Z_0$=50 Ohms for the antenna of FIG. 6a.

DETAILED DESCRIPTION

Figure 1A:
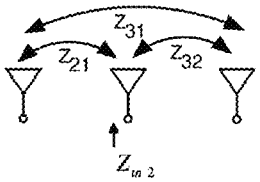
FIGS. 1a-1d are schematic representations of a 3-element antenna array illustrating in FIG. 1a the mutual coupling impedances ($Z_{21}$, $Z_{31}$ and $Z_{32}$) and in FIG. 1b the self- and mutual-coupling mitigation circuits ($Z_{S1}$, $Z_{S2}$, and $Z_{S3}$; and $Z_{c12}$ and $Z_{C23}$). In addition.
Figure 1B:
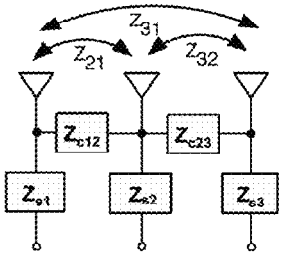
Figure 1C:
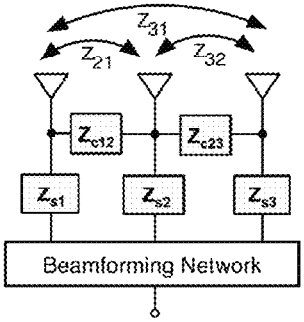
Figure 1D:
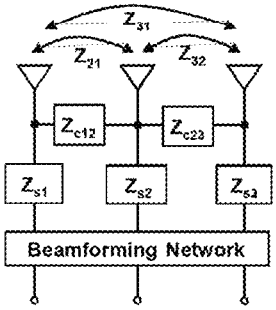
Figure 1E:
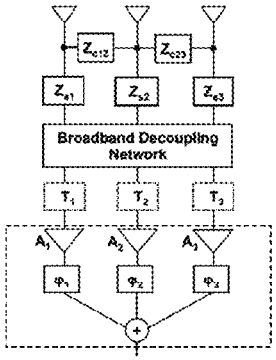
FIG. 1e is a schematic representation of a 3-element antenna array coupled via a decoupling network, amplifiers and phase controllers to a common port.

Three attractive features of antenna arrays are MIMO operation, beam-synthesis and reconfigurability. Array synthesis techniques are available in the literature that show how to (a) increase the directivity of the array without increasing its physical size (i.e. superdirectivity) and (b) generate nulls in the radiation pattern that will provide immunity to jamming signals. However, these techniques have severe limitations in real arrays due to mutual coupling; the input impedance at any given element is a function of the array excitation. For example, referring to FIGS. 1a-1e, which present schematic representations of a 3-element antenna array depicting mutual coupling:

$$Z_{in,2} = Z_{22} + \frac{i_1}{i_2} Z_{12} + \frac{i_3}{i_2} Z_{32} \qquad \text{(Eqn. 1)}$$

where $Z_{in,2}$ is the input impedance at antenna element 2, $i_m$ is the excitation current of the $m^{th}$ element and $Z_{mn}$ are elements in the impedance matrix of the array. The array of antenna elements may be a linear or a non-linear array. When the array is excited in order to generate a superdirective pattern, mutual coupling drives the real part of the input impedance to zero, while having a much weaker effect on the imaginary (i.e. reactive) part. This results in the well-known property of superdirective arrays: high antenna Q and the corresponding efficiency/bandwidth limitation. In addition, the input impedance varies as the beam is reconfigured. Due to these limitations, superdirective antenna arrays are widely regarded as problematic and are not widely deployed outside of direction finding (DF). The present invention can be used with DF, if desired, as it should improve DF performance either by improving sensitivity with the same directivity or by further improving directivity.

It should also be noted that while three element arrays are depicted in FIGS. 1a-1e, the mathematics is not so limited. The number of antenna elements can be equal to or greater than the number two. Typically, a larger number of elements improves directivity.

This invention can reduce the Q of electrically-small and superdirective antennas by >10× by placing NFCs both in series with the elements and in between nearest neighbor elements. See FIG. 1b, where $Z_{C12}$ and $Z_{C23}$ are NFCs that reduce the mutual reactance, and $Z_{S1}$-$Z_{S3}$ are NFCs that cancel the self reactance.

With passive circuit elements, reactance may be cancelled over narrow bandwidths by resonating negative (capacitive) reactance with an inductor and positive (inductive) reactance with a capacitor. But due to the narrow bandwidth when using passive circuit elements, the passive circuit elements need to be continually retuned when used in a wider bandwidth application.

NFCs, on the other hand, employ active devices and therefore are not bound by Foster's reactance theorem. Typical NFCs are negative capacitors (which have reactance given by $$X = +\frac{1}{\omega |C|},$$

where C is the capacitance and w is the radian frequency) and negative inductors (which have reactance given by $X=-\omega|L|$, where L is the inductance). Therefore, capacitive reactance may theoretically be cancelled over all frequencies using a negative capacitor. In practice, this reactance cancellation has been limited to 1-2 decades to date by the frequency range of the devices and other practical aspects of the circuit design. In addition, the circuits may become unstable (leading to oscillation or latchup) if they are not correctly designed to operate in the particular antenna.

The performance of two exemplary antenna arrays has been calculated using modal decomposition. The first example (see FIGS. 2a and 2b) is a 4-element Adcock antenna array (four monopole antennas in a square arrangement) having a height of 150 mm and a separation of 30 mm (0.05λ and 0.01λ, respectively at 100 MHz, such that this embodiment is also an electrically small and superdirective antenna system). Due to the symmetries of this 4-element array, the four independent (i.e. decoupled) modes can be generated by even/odd symmetry (note that these modes are not normalized):

$$I_1 = \begin{bmatrix} 1 \\ 1 \\ 1 \\ 1 \end{bmatrix} \quad I_2 = \begin{bmatrix} 1 \\ 0 \\ -1 \\ 0 \end{bmatrix} \quad I_3 = \begin{bmatrix} 0 \\ 1 \\ 0 \\ -1 \end{bmatrix} \quad I_4 = \begin{bmatrix} 1 \\ -1 \\ 1 \\ -1 \end{bmatrix} \qquad \text{(Eqn. 2)}$$

The numbers in Eqn, 2 are antenna excitation weights produced by a beamforming network. "1" means that the antenna is excited with a magnitude 1 and phase 0; "−1" means magnitude 1 and phase 180 deg, and "0" means that the antenna is weighted with magnitude 0 for the beam. The subscripts reflect the mode numbers. Adding the $-C_C$ NFCs does not affect the modes because it does not affect the symmetry (neglecting any mismatch between them).

Figure 2A:
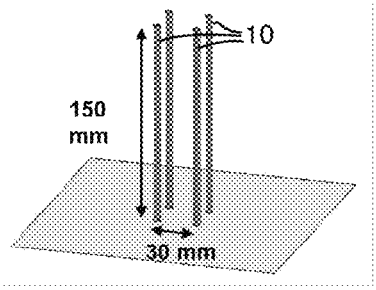
Figure 2B:
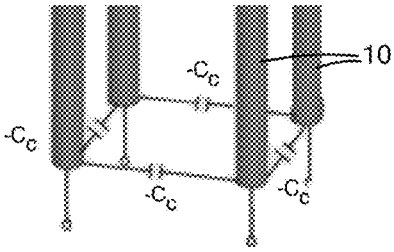
FIG. 2b shows a configuration for mutual reactance cancellation using four non-Foster negative capacitors ($-C_C$) with the 4-element Adcock array of FIG. 2a and FIG. 2c depicts modal reactance with Non-Foster Circuits (NFCs) connected between adjacent antenna elements 10 and without the mutual-reactance cancellation (unmatched). Only the lower portion of a 4-element Adcock array made from four monopole antennas 10 is shown in FIG. 2b so that the four non-Foster negative capacitors ($-C_C$) can be more easily depicted.
Figure 2C:
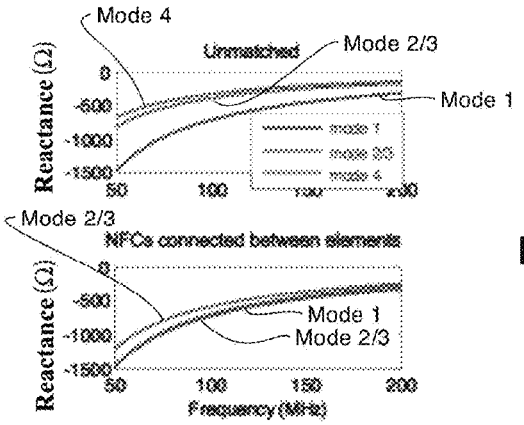

The modal reactance is plotted in the top plot of FIG. 2c; it is apparent that the reactance of mode 1 is significantly larger in magnitude than that of modes 2-4. Therefore, the self reactance of all modes cannot be cancelled simultaneously using the $-C_S$ NFCs that are placed in series with the antenna elements and substantially cancel the reactance of all modes (shown in the bottom plot of FIG. 2c for the 4-element array). However, connecting negative capacitors, $-C_C$, between nearest neighbor elements (see FIG. 2b) reduces the effect of the mutual reactance, thereby bringing the reactance of all modes to nearly the same value (see the bottom plot of FIG. 2c) so that the series reactance of all modes can be substantially cancelled simultaneously. This is illustrated for four and eight element Adcock antenna arrays in FIGS. 3a and 4a, respectively. In both embodiments, the realized gain of all modes is improved using only series NFCs (the $-C_S$ capacitors). However, when inter-element NFCs (the $-C_C$ capacitors) are also included, significant further improvement is achieved. To a first order, the self and mutual (nearest neighbor) reactances of the array are well approximated over broad bandwidth as capacitors. $-C_S$ is chosen to provide the negative of the self reactance over frequency and $-C_C$ is chosen to provide the negative of the mutual reactance over frequency. A first step to choosing $-C_C$ is to calculate the impedance matrix of the array, approximate the mutual reactance between nearest neighbors (i.e. the imaginary part of the terms of the impedance matrix that relate the coupling between nearest neighbors) by a capacitor, and take the negative of that capacitance. Alternatively, one can calculate the impedance of the array loaded by the $-C_C$ NFCs (omitting the $-C_S$ NFCs) and adjusting the $-C_C$ NFCs until the reactances of the modes are nearly identical.

Figure 3A:
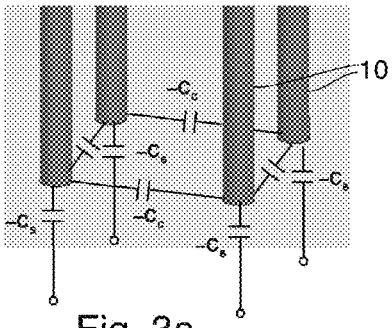
FIG. 3a shows a configuration of the 4-element Adcock array with both self and mutual reactance cancellation using negative capacitors and FIG. 3(b) shows the improvement in Signal-to-Noise Ratio using series only and both series and inter-element ideal NFCs.
Figure 3B:
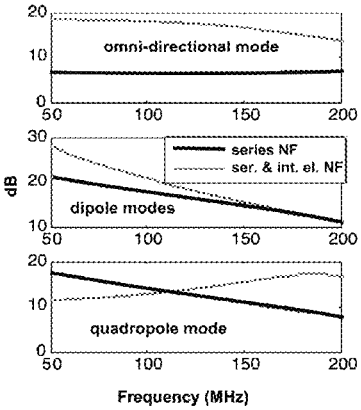
Figure 4A:
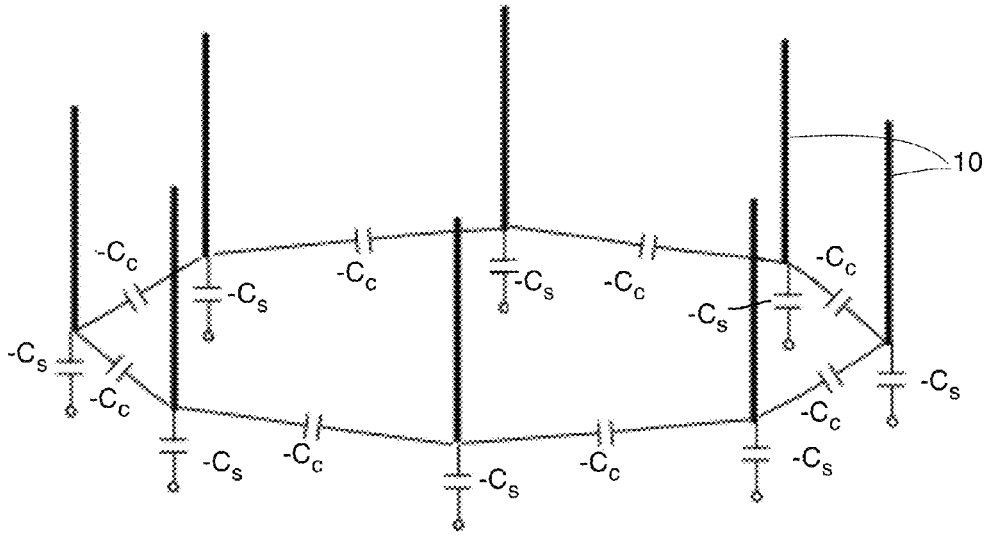
FIG. 4a depicts a configuration of the mutual reactance cancellation circuits for the 8-element Adcock array. Improvement in Signal-to-Noise Ratio using series only and both series and inter-element ideal NFCs is shown in FIG. 4b.
Figure 4B:
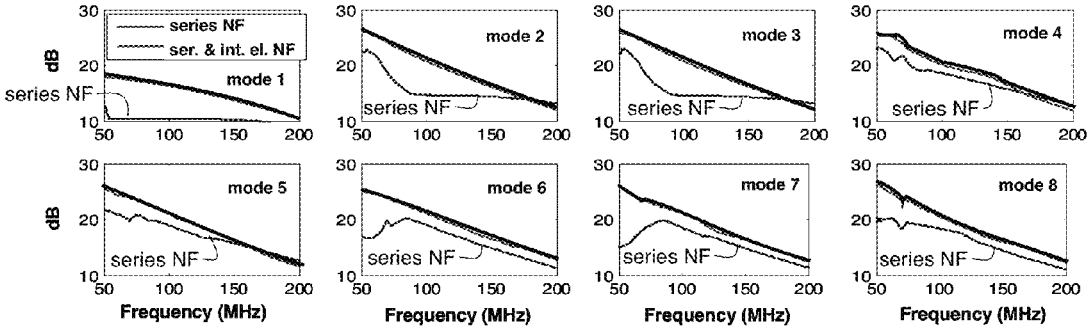
Figure 5A:
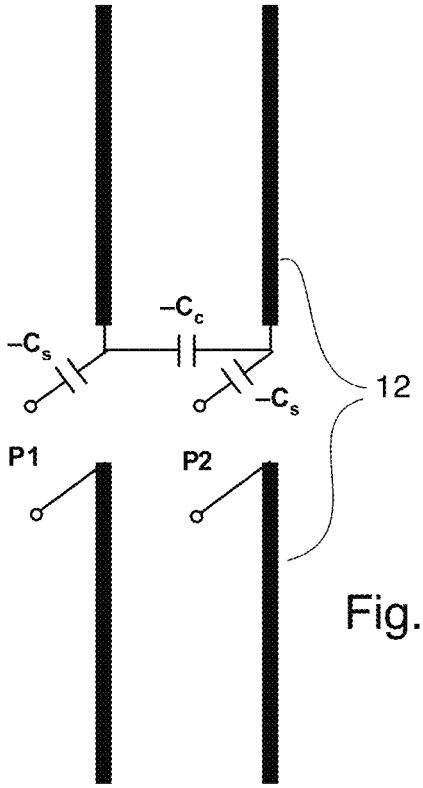
FIGS. 5a and 5b depict two possible embodiments of 2-element Adcock arrays wherein the individual radiating elements are dipoles.
Figure 5B:
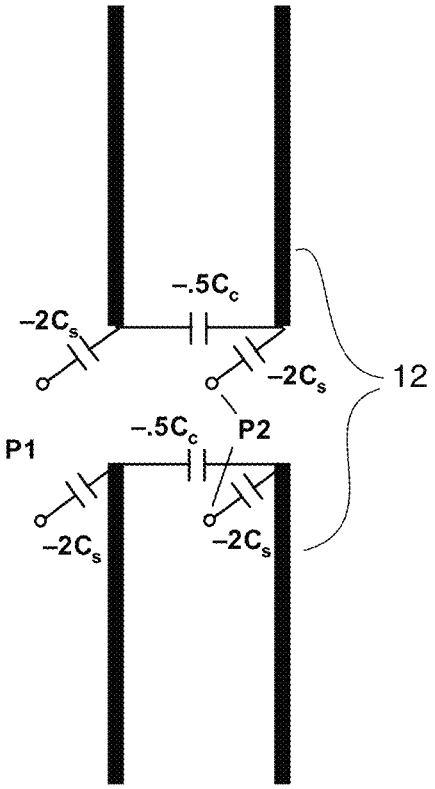

The Adcock array embodiments depicted by FIGS. 2a, 3a, and 4a, are implemented with monopole antenna elements 10. The depicted monopole antenna elements 10 can be replaced with dipole antenna elements 12 as shown in the embodiments of FIGS. 5a and 5b. In the embodiment of FIG. 5a the $-C_C$ NFCs and $-C_S$ NFCs are applied to only one element 10 of each the two dipoles depicted. In the embodiment of FIG. 5b the $-C_C$ NFCs and $-C_S$ NFCs are applied to both elements 10 of each the two dipoles depicted, however their values are changed compared to the embodiment of FIG. 5a. In the embodiments of FIGS. 5a and 5b, port P1 is the antenna port for the first dipole antenna while port P2 is the antenna port for the second dipole antenna. In the embodiment of FIG. 5a, the negative capacitive loading is unbalanced while the negative capacitive loading is balanced in FIG. 5b, so between these two embodiments, FIG. 5b may be preferred.

If monopole antenna elements 10 are used, they are essentially one half of a dipole, with a ground plane (which is not shown in Adcock array embodiments depicted by FIGS. 2a, 3a, and 4a) serving as the other half of the dipole.

Referring again to FIGS. 1a-1e, it should be recalled that the discussion above started with a discussion of impedances and then when it came to a presentation of the embodiments of FIGS. 2a, 3a, 4a, 5a and 5b, and the impedances were implemented with negative capacitors. But it is believed that still better results can be obtained if a negative resistance ($-R_C$) is placed in series with the negative capacitance $-C_C$ implemented by the NFCs. Simulations have been done on an electrically small 2-element array of monopoles 10 (see FIG. 6a). Without implying a limitation, dipoles can be used instead of the monopoles 10 as is discussed above. The ground plane for the monopoles is not shown. It could be earth ground or an electrically grounded plate from which the monopoles would project (but be electrically isolated therefrom).

Figure 6A:
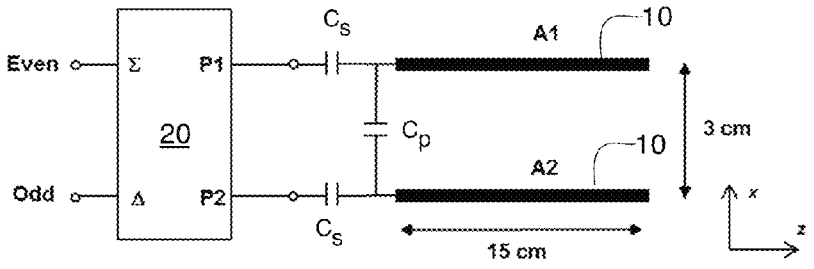

FIG. 6a depicts the geometry of a 2-element antenna array where radiating elements A1 and A2 are monopoles (they also could be dipoles, without implying a limitation) formed, for example, as wire antennas (again without implying a limitation). Capacitors Cs and Cp are negative and preferably cancel the self and mutual reactance, respectively, of monopoles A1 and A2. A sum-difference network 20 may be used to decompose the antenna array into even and odd modes. The circuits depicted in FIG. 5 or 5a of U.S. patent application Ser. No. 13/856,403 filed on Apr. 3, 2013 and entitled "Broadband non-Foster Decoupling Networks for Superdirective Antenna Arrays" may be used to implement network 20. Alternatively, passive 180 degree hybrid couplers known per se in the prior art could alternatively be used to implement network 20.

Figure 6B:
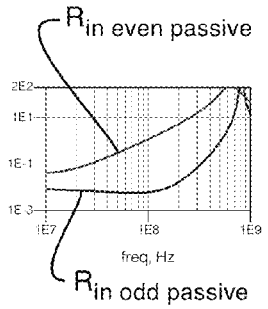
FIG. 6b depicts far field radiation resistance.

Multiple-element antenna arrays, typically having between two and eight elements, are useful for applications of superdirectivity, MIMO wireless communications, and antenna diversity, among others. When spaced much closer than one wavelength, they may be also be building blocks for Adcock direction-finding arrays. It will be assumed for the remainder of this discussion that the antenna spacing is less than one tenth of a wavelength. The 2-element array is preferably decomposed into two independent modes by a sum-difference decoupling network. The even and odd modes have omnidirectional and figure-8 patterns, respectively, in the x-y plane. It should be apparent that any utility of the second antenna may only be realized by coupling to both modes. This can be challenging because the odd mode does not radiate efficiently; monopoles A1 and A2 are then out of phase, so the radiation interferes destructively in the far field, leading to low radiation resistance (see FIG. 6b). The reactance, on the other hand, is only slightly cancelled (see FIG. 7 graph (a)), resulting in very high antenna Q. The Bode-Fano Criterion then dictates a bandwidth-efficiency tradeoff when using state of the art passive matching techniques.

Figure 7:
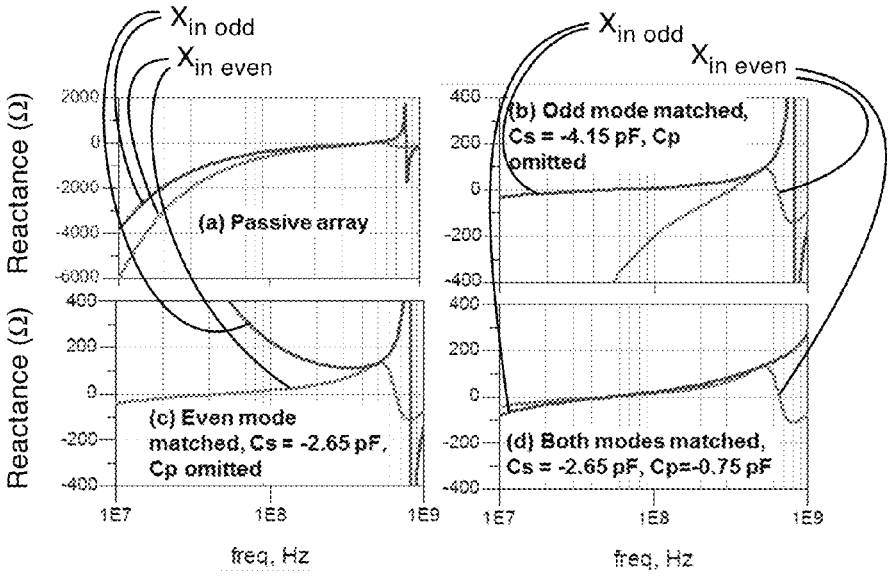
FIG. 7 depicts fours graphs of simulated even and odd mode reactance for a passive array (graph (a)), an odd mode matched array (graph (b)), an even mode matched array (graph (c)) and a both modes matched array (graph (d)).
Figure 8:
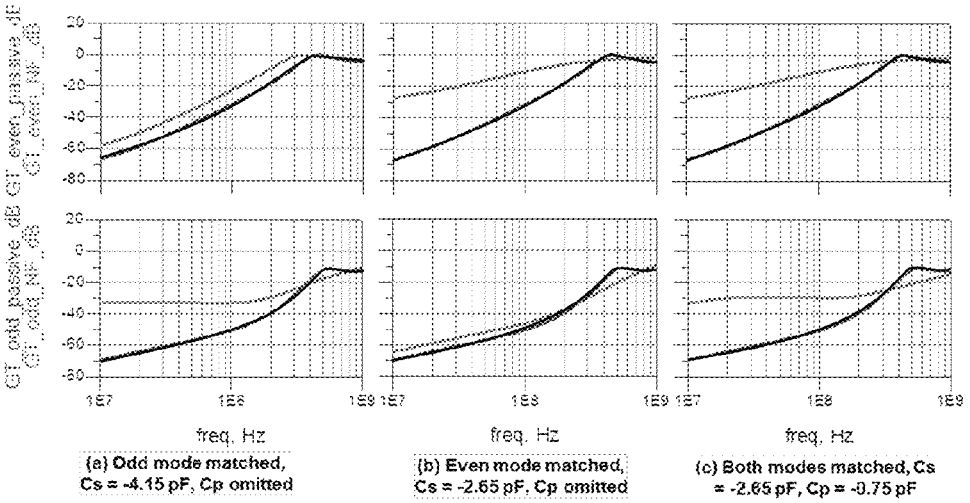

Non-Foster circuits are employed to reduce the reactance preferably by a factor of ten or more. The reactances of both the even and odd modes are well approximated by a capacitor (i.e. $-1/f$ where f is the frequency), but the odd mode reactance is 30% smaller than that of the even mode. Non-Foster matching cancels the reactance of small wire antennas with series negative capacitors (Cs in FIG. 6a). However, it is clearly seen in FIG. 7 graphs (b) and (c) that this technique is not capable of simultaneously matching both modes; substantial reactance remains in the unmatched mode. This residual reactance has a detrimental effect on the transducer gain (the ratio of power accepted by the antenna array to the available power), as seen in FIG. 8, where the mode that is not well matched shows minimal improvement in gain. In this invention, on the other hand, the reactance of the even and odd modes is set to be approximately the same by canceling the mutual reactance with negative capacitor Cp (FIG. 6a). It is seen in FIG. 7 graph (d) and FIG. 8 graph (c) that this enables a simultaneous even and odd mode match and a significant improvement in the transducer gain. Negative capacitor Cp discussed with respect to FIGS. 6a-12 corresponds to negative capacitor $C_C$ discussed with respect to FIGS. 1-5.

While the foregoing discussion shows the benefit of the topology of FIG. 6a, circuit stability should also be addressed. The equivalent circuit of the two element array of FIG. 6a (valid from 0-200 MHz and approximate up to about 400 MHz) is shown inside the dotted box of FIG. 9a, where $+\eta_0$=377 Ohms, Ca=3.2 pF, La=24.5 nH, R12=45 Ohms, C12=14.6 pF and L12=8.4 nH. The non-Foster circuits, Cs and Cp, and port impedances $Z_o$ are also shown. Resistor Rps, which is shown connected in series with negative capacitor Cp, will be discussed later. Mesh currents i1, i2, and i3 are described in the frequency domain by a 3×3 impedance matrix; the natural modes are found by solving for the zeros in complex frequency ($s=j2\pi f$) of the determinant of this impedance matrix. The network is stable if all zeros are in the left half of the s plane. Instability means that the amplitude of the currents (whether oscillation or not) will increase exponentially with time despite a finite excitation. While the 3×3 matrix method is rigorous, the stability of the even and odd modes by themselves has been analyzed by looking at the loop impedances and checking for right-half-plane zeros. In practice an unstable system exhibits either latch up or oscillation.

Figure 9A:
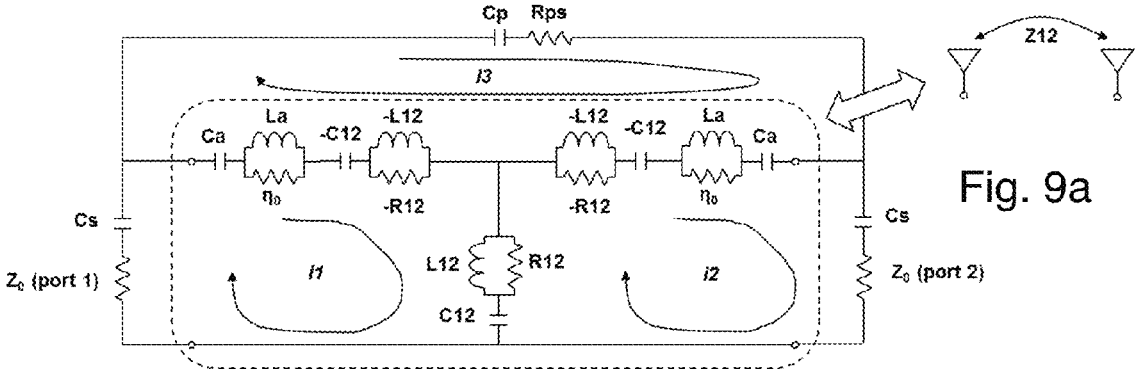
FIG. 9a is an equivalent circuit of the two element array of FIG. 6a (within the dotted enclosure), but with an added negative resistor Rps, and with port impedances $Z_o$ also shown for ports P1 and P2.
Figure 9B:
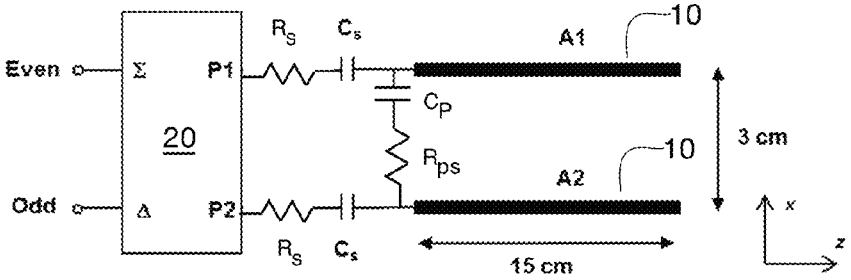
FIG. 9b is the same as FIG. 6a except the negative resistor Rps is added as are two optional negative resistors Rs.

FIG. 9b is the same as FIG. 6a, except that (i) a negative resistor Rps is shown in series with negative capacitor Cp and (ii) two optional negative resistors Rs are shown in series with negative capacitors Cs. Negative resistors Rs are less important to stable operation than is negative resistor Rps since the values of Rs can be set to zero (they can be removed from the circuit) and the resulting circuit appears to be stable. Negative resistors Rs are discussed in greater detail below with reference to FIG. 11.

If Cs and Rps are omitted, there is no value of Cp<0 that results in a stable network. However, the network is stabilized for both modes by introducing Rps<−90 Ohms, for example. The stability of the network vs. Cs and Cp is plotted in graph (a) of FIG. 10a where Rps is selected to be −90 Ohms. The even mode is stable if Cs<−2.65 pF and unstable otherwise, while the odd mode stability depends on both Cs and Cp. If Cp is omitted (analogous to Cp=0 on the right hand side of the plot), the odd mode is stable for Cs<−4 pF. However, introducing Cp allows (with Rps=−90 Ohms) the odd mode to be stable for higher values of Cs. The utility of this is seen in graphs (b) and (c) of FIG. 10a, which plot the transducer gain of the even and odd modes, respectively, at stable values of Cp and Cs. The odd-mode gain is maximized along the right edge of the stable region, but the even mode gain is maximized at the top of the stable region. In one exemplary embodiment, the optimum point is approximately Cp=−0.75 pF and Cs=−2.65 pF, which is the same as shown in FIGS. 7 and 8.

Figure 10A:
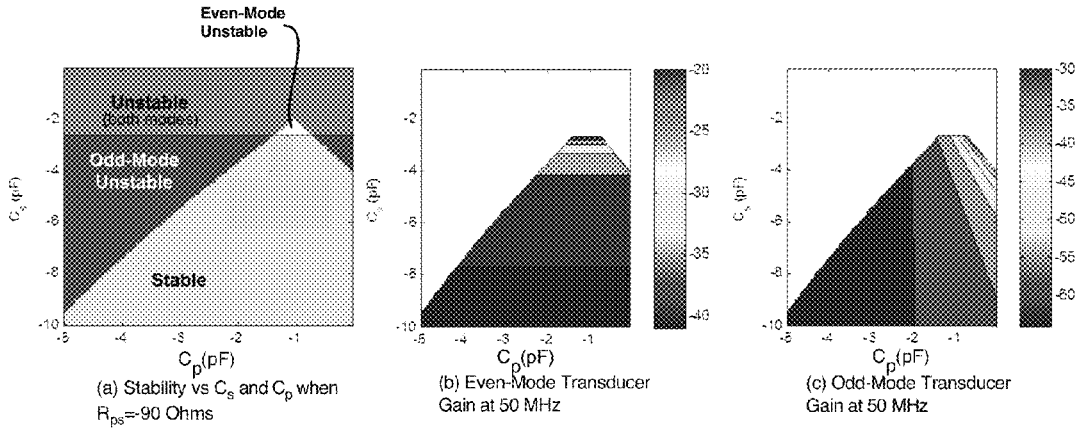
FIGS. 10a-10c depict stability and gain diagrams comparing various values of Cp, Cs and Rps for the antenna of FIG. 9b.
Figure 10B:
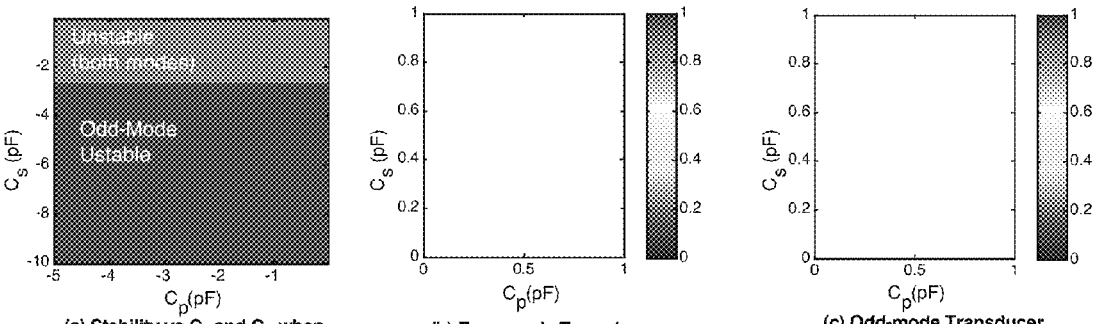
Figure 10C:
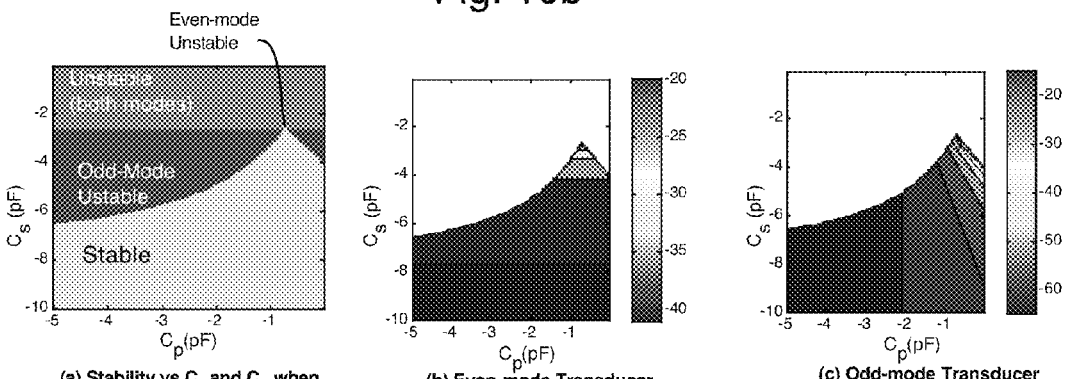

FIG. 10b provides the same plots as described above for FIG. 10a, but Rps is selected instead to be equal to −75 Ohms. Note that there are no values of Cp and Cs which result in stability for both modes when Rps is equal to −75 Ohms (only the even mode can be made stable). On the other hand if Rps is selected to be equal to −300 Ohms (see FIG. 10c), a stable embodiment of the antenna of FIG. 9b can still arise for both modes with appropriate selections for the values of Cp and Cs. As can be seen, as the absolute value of the negative resistance approaches zero, the circuit becomes unstable for the odd mode. The precise value of Rps where stability is first obtained for both modes will depend on the size and configuration of the two monopole antennas A1 and A2.

Figure 11:
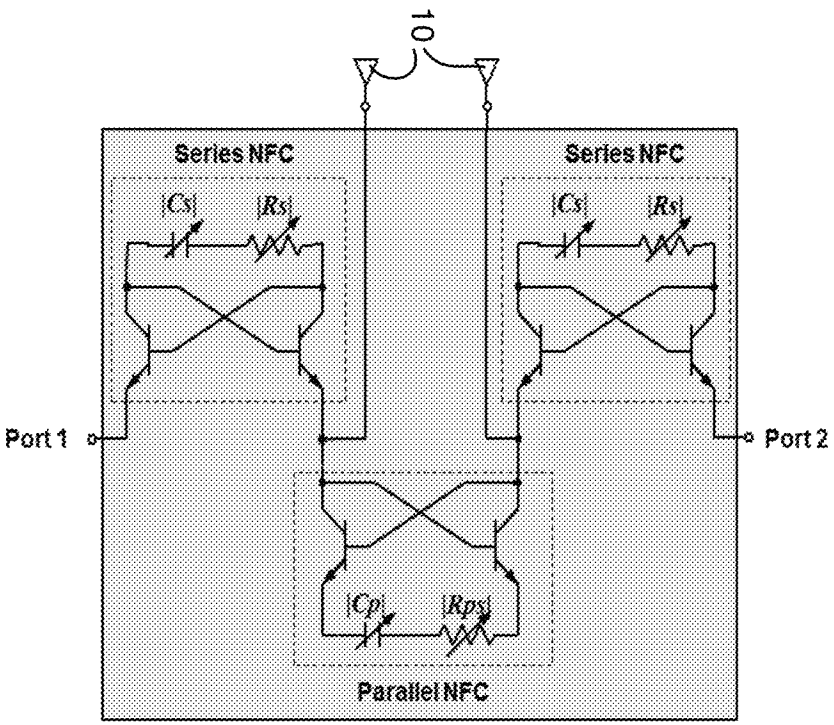
FIG. 11 is a simplified schematic of three non-Foster networks, two of which (Series NFC) are coupled between the ports (used to couple the antenna to a receiver for example, typically via beamforming networks and/or decoupling networks (if used)) to the elements 10 while the remaining non-Foster network (the Parallel NFC) is coupled directly between neighboring antenna elements 10.
Figure 11:
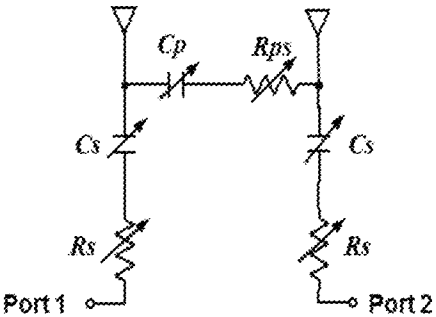

The self/mutual impedance compensation network for a two element antenna array can be realized as shown in FIG. 11. Three Linvill Negative Impedance Converter (NIC) circuits convert positive model circuits—each comprising a variable resistor and a variable capacitor—to their negative equivalents. The series circuits are in the open-circuit-stable (OCS) configuration and the mutual-element circuit is in the short-circuit-stable (SCS) configuration. Cs, Cp, and Rps have already been discussed; negative resistor Rs is preferably added to cancel any parasitic series resistance that the circuit introduces. The main contributor to this series resistance is the finite transconductance gm of the transistors; the Linvill circuits add a resistance of 2/gm and −2/gm in the OCS and SCS configurations, respectively. Rs, Cs, Cp, and Rps are tunable/variable in the preferred embodiment so that they may be configured to their optimal values in situ, despite fabrication tolerances and other unknowns; however, scope of this invention also includes all cases where one or more of the component values are fixed. In addition, it is obvious to one of ordinary skill in the art that the NPN transistors in FIG. 11 may be replaced with PNP, NFET or PFET transistors.

Figure 12:
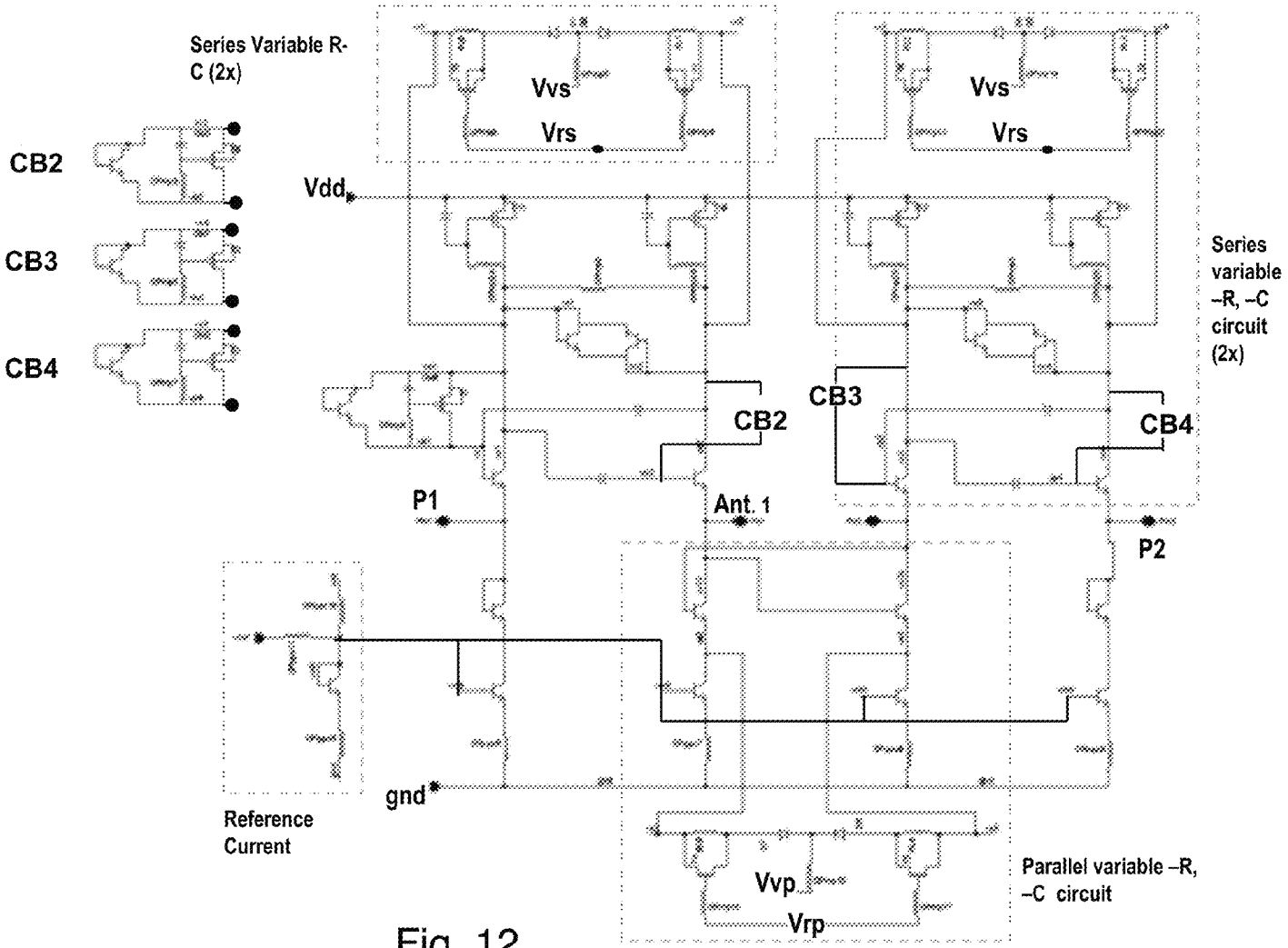
FIG. 12 is a detailed schematic diagram of a preferred embodiment of the NFC used to implement the Series and Parallel NFCs of FIG. 11 as a single circuit.

A series/mutual impedance compensation network has been designed for the IBM 8HP BiCMOS process, and the detailed schematic is shown in FIG. 12. The circuit comprises four branches between Vdd=5V and ground. Each branch preferably carries 2 mA of quiescent current that is driven by current mirrors (the bottom row of NPN transistors). Active loads (the top row of PMOS transistors) present a high impedance to the NICs while dropping about 1.6 V. The series NICs (Rs, Cs) are realized in the top row of NPN transistors, which comprise two cross coupled pairs. The variable capacitance and resistance are realized by back-to-back varactor diodes and linear-region PFETs, respectively, that are controlled by tuning voltages. DC blocking capacitors in the feedback loop prevent the circuit from latching, and the transistors are self-biased by high impedance networks that connect the collectors and bases. These networks include diodes connected from collector to base to prevent the device from breaking down during power-up or when subjected to large signals. In addition, antiparallel diodes between the collectors of each NIC prevent the circuits from latching during powerup. In FIG. 12 Vvs controls the series capacitance Cs, Vrs controls the series resistance Rs, Vvp controls the parallel capacitance Cp and Vrp controls the series resistance Rps.

The mutual-element NIC is realized by the center two NPNs of the $2^{nd}$ row from the bottom, where the variable capacitance and resistance are realized by back-to-back varactor diodes and linear-region NFETs, respectively. Both are controlled by a tuning voltage. The outer (diode-connected) NPNs of the 2nd row merely provide a voltage drop for biasing the network. It is apparent that the series and inter-element NICs share the same bias current. This arrangement has the advantages of minimizing both circuit parasitics and power consumption.

Figure 13:
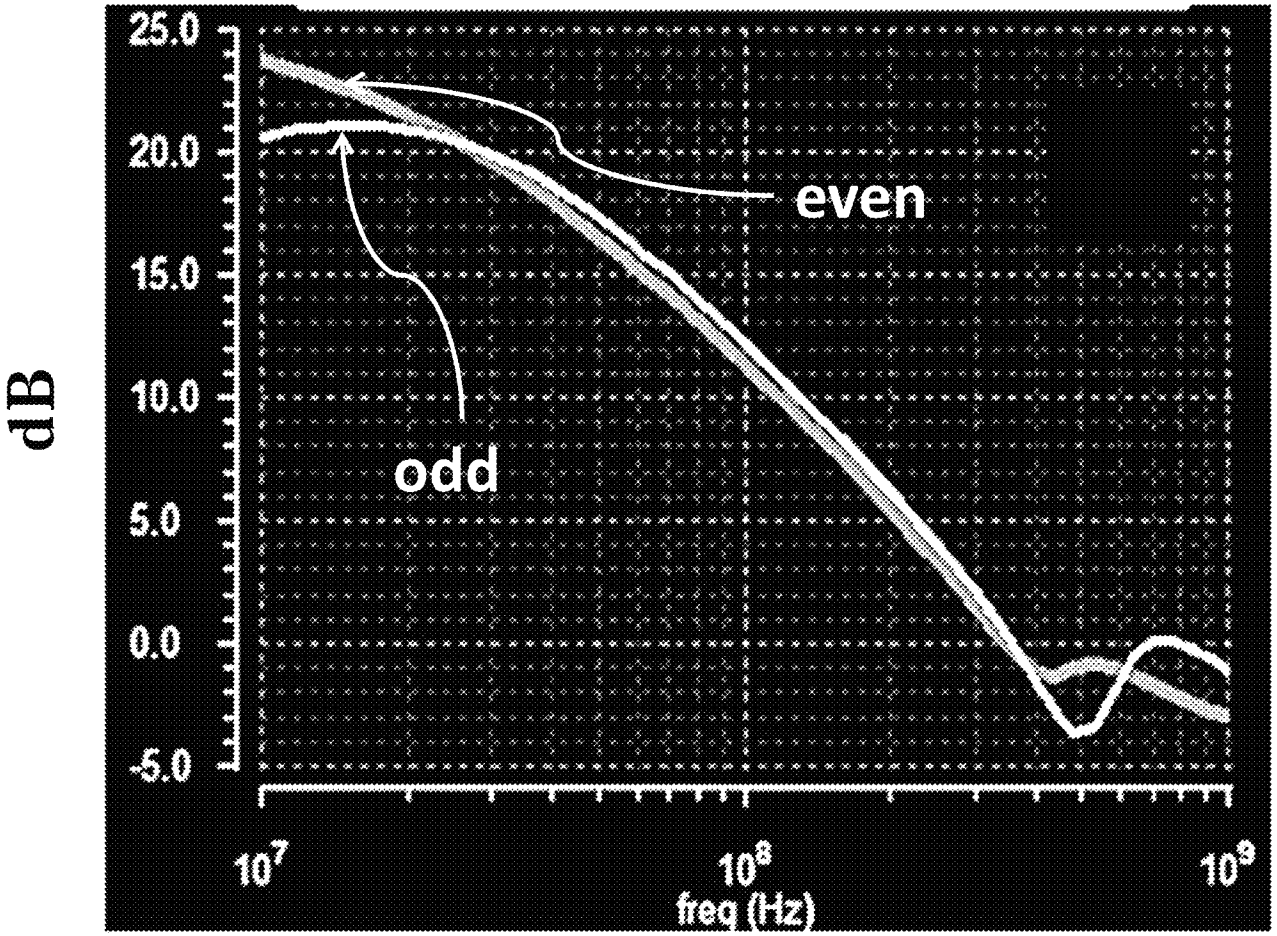
FIG. 13 depicts the imulated improvement in transducer gain of both the even and odd modes relative to the unmatched case using the circuit in FIG. 12.

The circuit of FIG. 12 has been simulated using Cadence Spectre for both stability and transducer gain. Transient simulations predict stable operation of the circuit within similar bounds as shown in FIG. 10. The simulated improvement in transducer gain over the unmatched case is shown in FIG. 13. The network improves the gain by >10 dB from 10-100 MHz.

Figure 14:
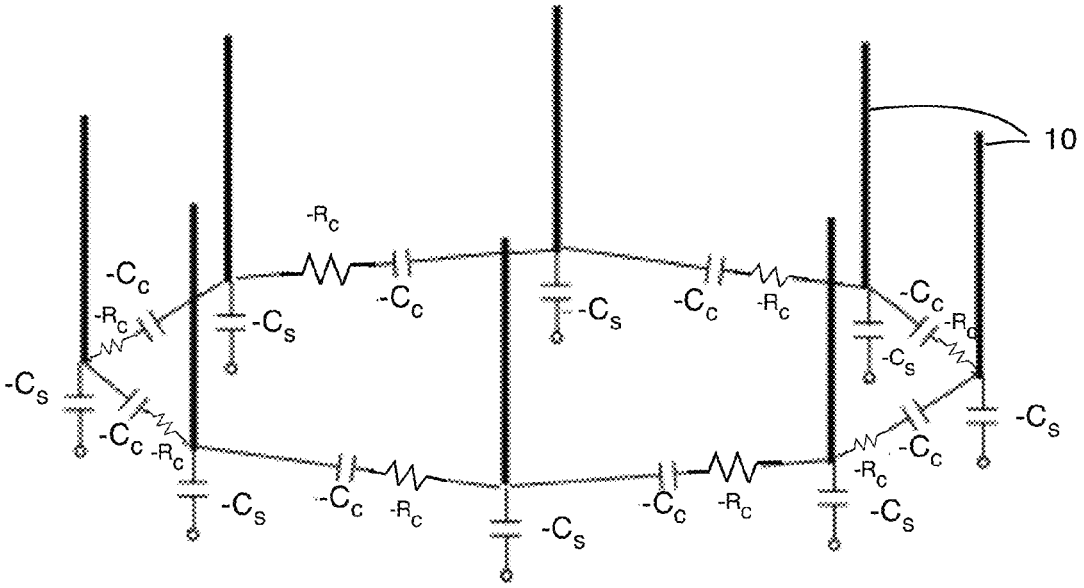
FIG. 14 is very similar to FIG. 4a with negative resistors shown in series with the negative capacitors −Cp.

Based on the results of the antenna of FIG. 9a having two monopole radiating elements, the addition of a negative resistance in series with the negative capacitor Cp can result in stability over even and odd modes of excitation. And it is believed that this concept can be expanded to the Adcock arrays of FIGS. 2b, 3a and 4a to improve their stability as well by inserting a negative resistance $-R_C$ in series with negative capacitors $-C_C$. It is suggested that the analysis set forth above can used as a starting point to determine reasonable values of Rps for a two element antenna (as in FIG. 9a), and that the Adcock arrays of FIGS. 2b, 3a and 4a (for example) be viewed as an expansion of the two element array of FIG. 9a for the reasonable values determined for Rps be used for $-R_C$ in the arrays of FIGS. 2b, 3a and 4a. FIG. 14 shows an eight element Adcock array with series connected negative capacitors $-C_C$ and negative resistors $-R_C$ coupling the bases of the nearest neighbor radiating elements 10. Of course, negative resistors $-R_S$ could be placed in series with negative connected capacitors $-C_S$ (if used) Likewise, it is believed that connecting negative resistors in series with the $-C_C$ capacitors in the embodiment FIG. 5a and that connecting negative resistors in series with the $-0.5C_C$ capacitors in the embodiment FIG. 5b can improve the odd mode stability of those embodiments as well.

Attached hereto as appendices A and B are two technical papers (published after the date of the provisional application to which this application claims a benefit) which provide additional information. Appendices A and B are hereby incorporated herein by reference.

Designing for stability starts with simplicity, minimizing circuit parasitics and excess time delay within the feedback loops that make up the NFCs. The stability of the array can be analyzed first modeling the antenna array as either a) a matrix of rational functions or b) broadband frequency domain data and then a) extracting the poles of the full network matrix (including antenna array, NFCs, beamforming networks, receiver, etc) or b) using the Normalized Determinant Function (See A. Platzker and W. Struble, "Rigorous determination of the stability of linear n-node circuits from network determinants and the appropriate role of the stability factor K of their reduced two-ports," Third International Workshop on Integrated Nonlinear Microwave and Millimiterwave Circuits, October 1994). Method a) is applicable to pole-zero models of the NFCs, and both methods a) and b) are applicable to transistor implementations of the NFCs.

This concludes the description of the preferred embodiments of the present invention. Other layouts of various antenna types are within the scope of this invention including, without implying a limitation, linear layouts of monopole and dipole antennas, triangular, square, hexagonal layouts of monopole, dipole and spiral antennas. Thus, the foregoing description of one or more embodiments of the invention has been presented for the purposes of illustration and description. It is not intended to be exhaustive or to limit the invention to the precise form disclosed. Many other modifications and variations are possible in light of the above teaching. It is intended that the scope of this invention be limited not by this detailed description, but rather by the claims appended hereto.

What is claimed is:

1. An antenna array comprising two or more radiating elements, with nearest neighbor radiating elements connected together with a non-Foster circuit between terminals of the radiating elements such that a mutual reactance between the nearest neighbor radiating elements is reduced over a wider bandwidth than which would be obtained if the non-Foster circuits were omitted, *wherein the non-Foster circuit at terminals of the radiating elements is implemented as a series circuit of a negative capacitor and a negative resistor*.

2. The antenna of claim 1 wherein the radiating elements are monopole type antennas.

3. The antenna of claim 1 wherein the radiating elements are dipole type antennas.

4. The antenna of claim 1 further comprising additional non-Foster circuits connected in series with each radiating element such that the self-reactance of each radiating element is cancelled over said wider bandwidth.

5. The antenna of claim 1 further including a decoupling network.

6. The antenna of claim 1 further including a beamforming network.

[7. The antenna of claim 1 wherein the non-Foster circuit at terminals of the radiating elements implement a negative capacitor.]

[8. The antenna of claim 1 wherein the non-Foster circuit at terminals of the radiating elements implemented a series circuit of a negative capacitor and a negative resistor.]

9. The antenna of claim 1 wherein said two or more radiating elements comprise four or more radiating elements, wherein all nearest neighbor elements are all equally spaced relative to each other.

10. The antenna of claim 1 wherein said two or more radiating elements are arranged in an Adcock antenna array.

11. The antenna of claim 1 wherein said non-Foster circuit is connected between feed points of said radiating elements.

12. The antenna of claim 1 wherein said radiating elements are arranged in an Adcock array of radiating antenna elements.

13. The antenna of claim 1 wherein said non-Foster circuit realizes a negative capacitor wired in series with a negative resistor.

[14. An antenna network for coupling a antenna array having two driven antenna elements with a sum-difference network having two outputs, the sum-difference network comprising three negative capacitors, first and second ones of the three negative capacitors each being coupled in series between one of the outputs of the sum-difference network and one of the two driven antenna elements, with the third one of the three negative capacitors being coupled between the two driven antenna elements.]

15. [The antenna network of claim 14] *An antenna network for coupling an antenna array having two driven antenna elements to a sum-difference network having two outputs, the antenna network comprising three negative capacitors, first and second ones of the three negative capacitors each being coupled in series between one of the outputs of the sum-difference network and one of the two driven antenna elements, with the third one of the three negative capacitors being coupled between the two driven antenna elements, and* further including a first negative resistor coupled in series with the third one of the three negative capacitors between the two driven antenna elements.

16. The antenna network of claim 15 further including second and third negative resistors each one of which is coupled in series with one of the first and second ones of the three negative capacitors coupled between one of the outputs of the sum-difference network and one of the two driven antenna elements.

17. A method of improving stability of the odd mode of an antenna system having one or more negative capacitors coupling neighboring driven elements to one another, the method comprising inserting a negative resistor in series with each of the negative capacitors coupling neighboring driven elements to one another.

18. The method of claim 17 where the negative resistor has a value which is sufficiently large in absolute value to assure that in a signal analysis that all zeros are in a left half of an s plane analysis thereof.

[19. An antenna array comprising two or more antenna elements, with nearest neighbor antenna elements connected together at feed points of said antenna elements by a non-Foster circuit.]

20. [The antenna of claim 19] *An antenna array comprising two or more antenna elements, with nearest neighbor antenna elements connected together at feed points of said antenna elements by a non-Foster circuit,* wherein said non-Foster circuit realizes a negative capacitor wired in series with a negative resistor.

[21. A method of reducing the self reactance of a plurality of antenna elements disposed in an array of parallel antenna elements, the parallel antenna elements each having an axis which is laterally spaced the axes of other antennas in said array, the method comprising:

a. providing a plurality of first non-Foster circuits each connected in series between a transmitter and/or a receiver and a connection point of each antenna element disposed in said array, and b. providing a plurality of second non-Foster circuits connected between the connection points of neighboring antenna elements disposed in said array.]

22. [The method of claim 21] *A method of reducing the self reactance of a plurality of antenna elements disposed in an array of parallel antenna elements, the parallel antenna elements each having an axis which is laterally spaced the axes of other antennas in said array, the method comprising: a. providing a plurality of first non-Foster circuits each connected in series between a transmitter and/or a receiver and a connection point of each antenna element disposed in said array, and b. providing a plurality of second non-Foster circuits connected between the connection points of neighboring antenna elements disposed in said array,* wherein (i) said plurality of antenna elements comprise N antenna elements, (ii) the plurality of first non-Foster circuits comprise N first non-Foster circuits and (iii) the plurality of second non-Foster circuits comprise N second non-Foster circuits, and wherein the value of N is the same for the numbers of antenna elements, first non-Foster circuits and second non-Foster circuits.

23. The method of claim 22 wherein the first and second non-Foster circuit each realize a negative capacitor connected in series with a negative resistor.

*24. In combination, an antenna array having two driven antenna elements, a sum-difference network having two outputs, and a network comprising three negative capacitors, first and second ones of the three negative capacitors each being coupled in series between one of the outputs of the sum-difference network and one of the two driven antenna elements, with the third one of the three negative capacitors being coupled between the two driven antenna elements and further including a first negative resistor coupled in series with the third one of the three negative capacitors between the two driven antenna elements.*

*25. The combination of claim 24 further including second and third negative resistors each one of which is coupled in series with one of the first and second ones of the three negative capacitors coupled between one of the outputs of the sum-difference network and one of the two driven antenna elements.*

*26. The antenna array of claim 20 wherein the antenna elements each comprise an antenna with a corresponding feed point and wherein the non-Foster circuits connected between antenna feed points reduce mutual reactance between the antennas in said array.*

*27. The antenna array of claim 20 wherein the feed points of the antenna elements are connected to a beamforming network via additional non-Foster circuits.*

* * * * *